United States Patent [19]

Duchateau et al.

[11] 4,331,494

[45] May 25, 1982

[54] SOLAR PANEL AND METHOD OF MANUFACTURING A SOLAR PANEL

[75] Inventors: Jacques Duchateau, Recouignies; Maurice Nicolas, Maurepas, both of France

[73] Assignee: BFG Glassgroup, Paris, France

[21] Appl. No.: 141,487

[22] Filed: Apr. 18, 1980

Related U.S. Application Data

[63] Continuation of Ser. No. 915,124, Jun. 13, 1978, abandoned.

[30] Foreign Application Priority Data

Jun. 16, 1977 [GB]  United Kingdom ............... 25267/77

[51] Int. Cl.³ ..................... B32B 31/00; H01L 23/30; H01L 31/18
[52] U.S. Cl. ..................................... 156/87; 136/251; 156/286; 156/331.1; 156/331.7; 250/239; 264/261; 428/425.6
[58] Field of Search ................. 29/572, 576 R, 576 S, 29/588, 589; 136/89 CA, 89 EP, 251; 156/87, 99, 104, 107, 145, 285, 286, 331, 331.1, 331.7; 250/239; 264/4, 261, 1; 428/429, 431, 442, 425.6

[56] References Cited

U.S. PATENT DOCUMENTS

| | | | |
|---|---|---|---|
| 2,222,788 | 11/1940 | Touceda et al. | 136/89 CA |
| 3,382,137 | 5/1968 | Schreiber et al. | 428/429 X |
| 3,703,425 | 11/1972 | Delmonte et al. | 156/245 |
| 4,066,815 | 1/1978 | Olink et al. | 428/336 |

OTHER PUBLICATIONS

Beattie, John O., "Casting Plastics Sheets", Modern Plastics, Jul. 1956, pp. 109-117.

*Primary Examiner*—Edward C. Kimlin
*Assistant Examiner*—Robert A. Dawson
*Attorney, Agent, or Firm*—Cushman, Darby & Cushman

[57] ABSTRACT

A solar panel comprising at least one solar energy transducer laminated between a transparent vitreous sheet and a second sheet in which the transducer is imbedded in a layer of transparent polymeric material which bonds the sheets together. The polymeric material comprises an acrylic compound. A method of making the aforesaid solar panel in which the acrylic compound is allowed to set in situ is described.

12 Claims, 2 Drawing Figures

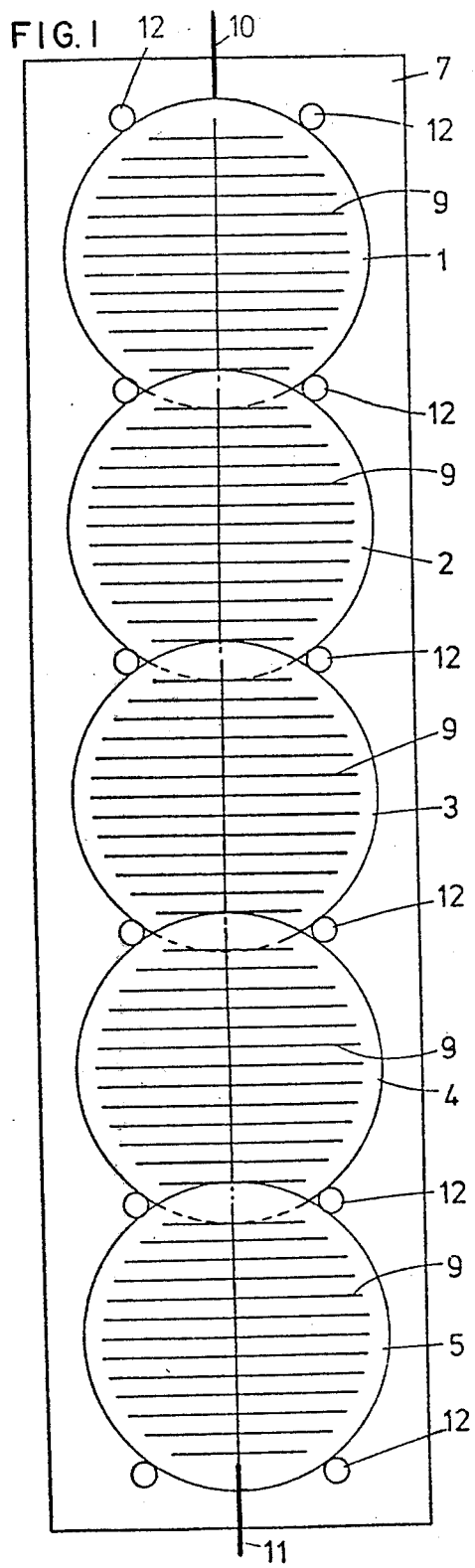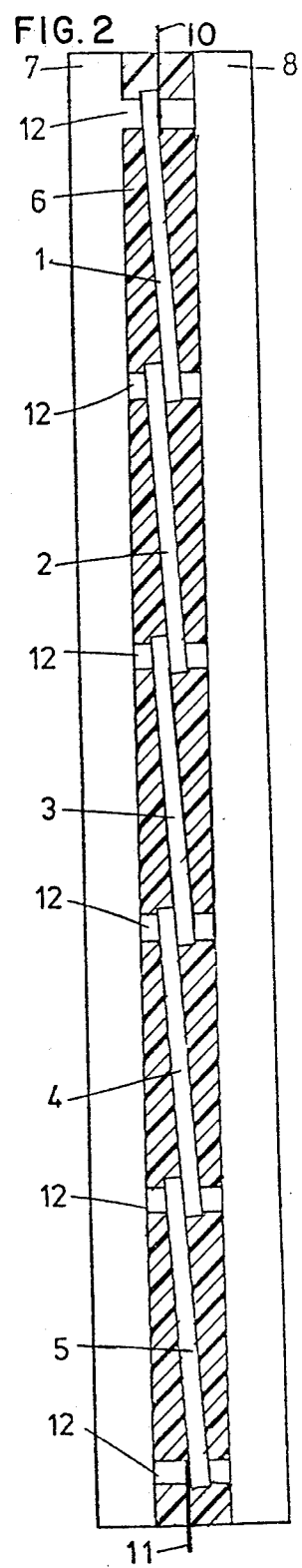

SOLAR PANEL AND METHOD OF MANUFACTURING A SOLAR PANEL

This is a continuation of application Ser. No. 915,124 filed June 13, 1978 and now abandoned.

The present invention relates to a method of manufacturing a solar panel comprising at least one solar energy transducer laminated between a transparent vitreous sheet and a second sheet. The invention also relates to such panels.

It is, of course, very well known to bond two glass sheets together to form a laminate using a sheet of adhesive plastics material. Perhaps the most common plastics material used for this purpose is polyvinyl butyral. In conventional laminating processes, the assembly of two glass sheets and an intervening plastics layer is subjected to heat, for example 120° to 140° C., and to pressure, say 10 N/cm$^2$, in order to effect bonding.

Unfortunately it has not proved possible to achieve consistently satisfactory results when using such a process when other articles are to be imbedded in the intervening plastics layer. This is particularly the case with solar energy transducers of various types. By way of example, one type of solar energy transducer is constituted by a thin disc of doped silicon which bears a conductive coating on one side and a conductive grid on the other. Such a disc may measure say 55 mm in diameter, and 0.1 to 0.3 mm in thickness. It will therefore be appreciated that there is considerable risk of breaking a solar energy transducer if it is sandwiched between two sheets of glass using a conventional laminating technique.

It is an object of the present invention to provide a method of manufacturing a solar panel comprising at least one solar energy transducer laminated between a transparent vitreous sheet and a second sheet which does not require such high temperatures and pressures, and which can therefore more consistently give a satisfactory result.

According to the present invention, there is provided a method of manufacturing a solar panel comprising at least one solar energy transducer laminated between a transparent vitreous sheet and a second sheet, which method comprises the steps of effecting the lamination with a fluid medium which comprises an acrylic compound and causing or allowing the fluid medium to set in situ to form a transparent polymeric layer in which the transducer is imbedded, and which serves to bond the sheets together.

The method according to the invention eliminates the need to press the sheets together using forces of a magnitude which would be likely to damage the transducer.

Many such fluid media can be transformed into the required solid state without the necessity of heating to high temperature. The fluid medium may include one or more additives such as a polymerization accelerator or cross-linking agent to allow polymerization to take place at a temperature below 60° C., or even between 20° and 40° C. In this way, stresses in the laminate due to contraction on cooling after polymerization of the resin are reduced. Other additives may be incorporated to decrease the sensitivity of the polymeric material to ultra-violet radiation.

Advantageously, the total amount of acrylic compound in the fluid medium is at least 30% by weight, and in some preferred embodiments of the invention, the total amount of acrylic compound in the fluid medium is at least 90% by weight of such medium. Preferably, the fluid medium comprises a methyl methacrylate resin. This also has the advantage of reducing stresses in the laminate, since methyl methacrylate resins can undergo polymerization with only a small change in volume.

Advantageously, the fluid medium comprises a mixture of methyl methacrylate and polyurethane prepolymer as main constituent. This provides a good compromise as between transparency, chemical stability, viscosity of the fluid medium and cost. Polyurethane prepolymers normally contain an unsaturated isocyanate, but to improve the resistance of the polymerized material to ultra-violet radiation, a saturated isocyanate such as 4, 4' diphenylmethane diisocyanate may be used.

There are several ways in which a panel may be assembled in accordance with the invention. For example, one sheet may be laid horizontally, the desired number of transducers may be positioned thereon and fluid medium may be coated over that sheet and the transducer before the other sheet is positioned. Alternatively, or in addition, the fluid medium may be applied before the transducer is positioned.

Preferably, however, the desired number of transducers is positioned on one of the sheets, the other sheet is assembled thereto, and the margins of the assembly are sealed, leaving a gap. There are various ways in which such sealing can be effected. For example, a marginal strip spacer member may be located between the sheets and held in position using clamps. Alternatively, a mastic or double faced adhesive strip or a silicone adhesive strip may be applied between the sheet margins. Another method is to apply adhesive tape around the edges of the assembly while holding the sheets apart with intervening spacers.

Advantageously, the transducer is held in position between the sheets by one or more spacers. Such spacers can be arranged to sustain any pressure forces across the space between the sheets, and can prevent the transducer from moving from the position where it was placed prior to and during the introduction of fluid medium. The spacers may be made of any suitable material, but they are preferably of a material which is of the same nature as the fluid medium. A spacer may, for example, be made from an already polymerized piece of the fluid medium or of some other acrylic polymer.

Preferably, the fluid medium is introduced between the sheets through the aforesaid gap after tilting the assembly. This helps to reduce the risk of forming bubbles of air within the polymeric layer. The sheets may be aligned in vertical planes, but preferably the sheets are inclined to the horizontal by less than 30° C., for example, at about 15° to the horizontal during the introduction of the fluid medium. This helps to exclude all the air between the sheets which would inhibit polymerization, and insures a more uniform wetting of the sheets and transducer by the fluid medium, and also promotes a more uniform laminar flow of the fluid medium into the inter-sheet space. Formation of bubbles in the fluid medium itself may also be reduced when the fluid medium is mixed and/or poured in a low pressure environment, e.g. 20 to 50 torr, as is preferred.

Preferably the transducer is totally encapsulated by the polymeric layer. By adopting this feature, the risk of a transducer being broken by a mechanical shock to the panel after completion is reduced since such a shock will no longer be directly transmitted to the transducer by one of the sheets.

Preferably the panel includes two or more transducers. In this way, the panel can be arranged to provide, for a given incident energy flux, a greater potential difference or a greater current according to whether the transducers are connected in series or in parallel. Advantageously, the transducers are arranged to overlap in series electrical contact, since this simplifies their electrical interconnection within the panel. Transducers arranged in such overlapping fashion are particularly apt to break so that the invention affords particular advantages in this case.

Advantageously, the second sheet is a vitreous sheet. Preferably each vitreous sheet is chemically tempered. This contributes greatly to the strength of the panel and to its resistance to breakage. Advantageously, such tempering is effected by an exchange of sodium ions from the sheet with potassium ions from a contacting medium.

In order to promote adhesion between the polymer layer and the vitreous sheet it is desirable that the vitreous sheet is treated with a primer. Such primer may, for example, comprise an organosilane. Acrylic silanes, such as γ-methacryloxypropyltrimethoxy silane, are especially preferred since they tend to increase the humidity resistance of the panels.

In order to improve the efficiency of the panel, it is preferred to make the transparent vitreous sheet thin, for example 1 to 2 mm, so as to reduce the amount of incident solar radiation which will be absorbed by it. Another way of reducing the radiation absorption of that sheet is to insure that the transparent vitreous sheet is made from a glass (see, for example, U.S. Pat. No. 4,066,815) which has a better total energy transmission for the solar spectrum than ordinary (e.g. soda-lime) glass.

Another way of increasing the incident solar radiation energy which is transmitted to the transducer is to give the transparent vitreous sheet an anti-reflection coating or coatings.

The invention includes a solar panel made by a method as defined, and also extends to a solar panel comprising at least one solar energy transducer laminated between a transparent vitreous sheet and a second sheet, wherein the transducer is imbedded in a layer of transparent polymeric material which serves to bond the sheets together, the polymeric material comprising as main constituent an acrylic compound or a mixture of acrylic compounds. Preferably, the acrylic compound is polymethylmethacrylate.

The invention also extends to a solar panel comprising at least one solar energy transducer laminated between a transparent vitreous sheet and a second sheet wherein the transducer is imbedded in a layer which bonds the sheets together, the polymeric material comprising as main constituent a copolymer of polymethyl methacrylate and polyurethane.

A preferred embodiment of the present invention will now be described by way of example with reference to the accompanying drawings, in which:

FIG. 1 is a plan view of a solar panel according to the invention in which five solar energy transducers are bonded in a transparent resin layer between two vitreous sheets, and FIG. 2 is a side elevation corresponding to FIG. 1, the resin layer being partly cut away.

It is to be emphasized that the thicknesses of the polymeric layer and transducers shown in FIG. 2 are greatly exaggerated.

In the drawing, five solar energy transducers 1, 2, 3, 4, 5 are bonded within a polymeric layer 6 between a transparent vitreous sheet 7 and a second vitreous sheet 8 to form a solar panel.

In a particular practical example each transducer is a silicon cell. The silicon is doped with a pentavalent material (usually phosphorus) and is in the form of a thin disc impregnated on one face with a trivalent material (usually boron) to form a p-n junction. As is well known, when infrared or visible light energy is incident on the boron impregnated face of such a cell, a potential difference is set up across the disc so that current can flow through a circuit of which it forms a part. A conductive grid 9, shown in the form of a fish-bone, is applied to the boron impregnated face of each disc, while the rear face of each disc bears a uniform conductive coating (not shown). The conductors may be of silver. As illustrated, the individual cells overlap at their edges so that they are in series electrical contact. By way of example, the fish-bone conductor 9 on the front face of the first cell 1 is in contact with the uniform conductive coating on the rear face of the second cell 2, while the fish-bone conductor 9 on that second cell 2 is in electrically conductive contact with the uniform coating on the rear face of the third cell 3. The silicon disc constituting the cells may have diameters of say 55 mm and thicknesses of say 0.1 to 0.3 mm. Such cells can each have an output of 0.6 ampere at 0.44 volt, so that in the arrangement shown, the output of the panel would be 0.6 A at 2.2 V.

Terminals 10, 11 are connected respectively to the rear face of the first cell 1 and to the fish-bone conductor 9 on the front face of the fifth cell 5.

Because of the size of the cells, they are apt easily to be broken, and care must be taken in assembling the panel which will protect them in use. In order to assemble and bond the panel together, one of the sheets 7, 8 is laid horizontally, and the five solar energy transducers 1, 2, 3, 4, 5 are laid on that sheet so that their edges overlap as shown in the drawings. A number of spacers 12 is positioned in such a way that when the other sheet is laid on top of them and the two sheets are pressed lightly together, the spacers serve to locate the transducers and also to protect them from pressure exerted by the faces of the sheets.

The sheets 7, 8 are sealed together at their edges, e.g. by running a length of adhesive tape around the edge faces of the panel, leaving a small gap, and the panel is tilted and fluid medium is introduced between the sheets through that gap.

One suitable fluid medium is a resin having a composition as follows (parts by weight):

| | |
|---|---|
| PLEXIMON 705 or 706 | 98.6% |
| Butyl monoterpermaleinate | 0.2% |
| benzoyl peroxide (50%) | 0.1% |
| triethyl phosphate | 0.7% |
| Röhm activator 17 (maleic naphthanate) | 0.4% |

PLEXIMON 705 and 706 (Trade Marks) are methyl methacrylate resins produced by Röhm.

This resin composition will polymerize in 8 hours at a temperature of between 20° and 30° C. This is an important feature, as is the fact that such polymerization will take place with at most a small change in volume of the resin, since it reduces mechanical stresses to which the transducers will be subjected to a minimum. When using a resin which polymerizes at high temperature, high stresses could arise due to differential contraction on cooling, or they could arise when using a resin which undergoes a substantial change in volume during polymerization. When using the resin composition specified above, a very suitable material for making the spaces 12 is as follows (parts by weight):

| PLEXIGUM M 920 | 500 parts |
|---|---|
| ethyl acetate | 1950 parts |
| butyl phthalate | 500 parts |

(PLEXIGUM M 920 is a trade mark of Röhm)

If desired, the vitreous sheets used may be chemically tempered. In one such treatment, glass sheets are immersed in a bath of molten potassium nitrate which is maintained at a temperature of 450° C. After cooling it is found that a proportion of sodium ions in the surface of the glass has been replaced by potassium ions, thus putting the surfaces of the sheets under compressive stress and rendering the sheets more resistant to breakage.

The use of a primer, for example a primer containing a silane, can enable organic molecules to be bonded directly to the vitreous material.

One suitable primer comprises (by weight):

| Isopropanol | 97.5% |
|---|---|
| γ-methacryloxypropyltrimethoxy silane | 1% |
| Acetic acid | 0.5% |
| Distilled water | 1% |

The γ-methacryloxypropyltrimethoxy silane used was Union Carbide's Silane A174.

As a variant a fluid resin was used having the following composition by weight:
60% a prepolymer of propylene which had been reacted with a diisocyanate condensed with β-hydrooxyethylmethacrylate
25% methyl methacrylate
15% acrylic acid.

This mixture polymerized in 10 hours at 50° C.

If the diisocyanate is replaced by a saturated diisocyanate such as 4,4' diphenylmethane diisocyanate, a resin is obtained which has a better resistance to ultra violet radiation.

In a further variant, the transducers 1, 2, 3, 4, 5 are laid side-by-side and are electrically interconnected by separate conductors.

In a further variant, not shown in the drawings, a body of polymethyl methacrylate adhesive is applied along the margins of three edges of one of the sheets which will form the panel, and the desired number of transducers is laid on that sheet in the desired arrangement. The second sheet is then applied, and after polymerization of the adhesive, a fluid medium for forming the polymeric layer is introduced through the gap left along the fourth edge of the panel after the panel has been tilted, so that it is at 15° to the horizontal.

If desired, the body of polymethyl methacrylate may be replaced by a strip of polyvinyl chloride to act as a spacer and edge sealer. If the spacing and sealing strip does not itself adhere to the sheets, it may be glued or simply held in place by edge clamps.

In a further variant, a number of individual spacers such as the spacers 12 shown in the drawings are used, but these are out of contact with the transducers. Such spacers may conveniently be made of polymethyl methacrylate, and the edges of the panel may be closed using adhesive tape.

Polymerization may be carried out using one or more accelerators, and/or by illuminating the layer with ultra-violet radiation.

It will, of course, be appreciated that the number of transducers in a row in a panel in accordance with the invention may be varied at will in dependence upon the power which is required, and that a panel may incorporate more than one row if desired. The various rows (where more than one is present) may be interconnected in series or in parallel. Alternatively, rows may be connected in parallel in groups, the groups being series interconnected, or groups of series interconnected rows may be interconnected in parallel. Such interconnection may be sealed within the panel, or terminals at the edges of the panel may be provided so that the user may choose (or alter) the systems of interconnection.

Other fluid media such as polyester adhesives and polyepoxy resins e.g. Araldite (Trade Mark) have been proposed.

The following is an example of a suitable polyester adhesive:

| Stratyl 108 CCL (Rhone Poulenc) | 98.9% by weight |
|---|---|
| 50% methlethylketone hydroperoxide in methyl phthalate | 1.0% by weight |
| Cobalt octoate (6% metal) (Rhone Poulenc) | 0.1% by weight |

It thus will be seen that the objects of this invention have been fully and effectively accomplished. It will be realized, however, that the foregoing preferred specific embodiment has been shown and described for the purpose of illustrating the functional and structural principles of this invention and is subject to change without departure from such principles. Therefore, this invention includes all modifications encompassed within the spirit and scope of the following claims.

What is claimed is:

1. A method of manufacturing a solar panel including at least one solar energy transducer laminated between a transparent vitreous sheet and a second sheet, which comprises the steps of effecting said lamination with a fluid medium which comprises an acrylic compound which polymerizes at low temperature without substantial change in volume and polymerizing said fluid medium in situ at a temperature below 60° C. to form a transparent polymeric layer in which said transducer is imbedded and which serves to bond said sheets together, said fluid medium comprising a mixture of methyl methacrylate resin and polyurethane prepolymer as main constituent.

2. A method as defined in claim 1 wherein the total amount of acrylic compound in said fluid medium is at least 30% by weight of such medium.

3. A method as defined in claim 1 wherein the total amount of acrylic compound in said fluid medium is at least 90% by weight of such medium.

4. A method as defined in claim 1 wherein said transducer is held in position between said sheets by spacer means.

5. A method as defined in claim 1 wherein prior to the utilization of said fluid medium a desired number of transducers is positioned on one of said sheets, the other sheet is assembled thereto, and the margins of the assembly are sealed, leaving a gap.

6. A method as defined in claim 5 wherein said fluid medium is introduced between said sheets through said gap after tilting the assembly.

7. A method as defined in claim 6 wherein after the assembly is tilted as aforesaid the sheets are inclined at an angle measured with respect to the horizontal of less than 30° during the introduction of said fluid medium.

8. A method as defined in claim 1 wherein said transducer is totally encapsulated by said polymeric layer.

9. A method as defined in claim 1 wherein said vitreous sheet has a primer applied to the bonded surface thereof.

10. A method as defined in claim 1 wherein said transparent vitreous sheet is made from a soda lime glass having a composition such that its total energy transmittance for solar radiation is greater than that of a similarly dimensioned ordinary soda lime glass which contains ferrous oxide, said glass having a composition which contains iron oxide with substantially all of said iron oxide being ferric oxide.

11. A method as defined in claim 1 wherein said polymerizing is at a temperature between 20° and 40° C.

12. A method of manufacturing a solar panel including at least one solar energy transducer laminated between a transparent vitreous sheet and a second sheet, which comprises the steps of effecting said lamination with a fluid medium which comprises an acrylic compound which polymerizes at low temperature without substantial change in volume and polymerizing said fluid medium in situ at a temperature below 60° C. to form a transparent polymeric layer in which said transducer is imbedded and which serves to bond said sheets together, said fluid medium being mixed and/or poured in situ in a low pressure environment of 20 to 50 torr.

* * * * *